(12) United States Patent
Bi et al.

(10) Patent No.: US 10,629,589 B2
(45) Date of Patent: Apr. 21, 2020

(54) RESISTOR FINS

(71) Applicant: INTERNATIONAL BUSINESS MACHINES CORPORATION, Armonk, NY (US)

(72) Inventors: Zhenxing Bi, Schenectady County, NY (US); Kangguo Cheng, Schenectady, NY (US); Juntao Li, Cohoes, NY (US); Peng Xu, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/991,143

(22) Filed: May 29, 2018

(65) Prior Publication Data

US 2018/0308837 A1 Oct. 25, 2018

Related U.S. Application Data

(62) Division of application No. 15/495,197, filed on Apr. 24, 2017, now Pat. No. 10,079,229.

(51) Int. Cl.
*H01L 27/06* (2006.01)
*H01L 49/02* (2006.01)
(Continued)

(52) U.S. Cl.
CPC .... *H01L 27/0629* (2013.01); *H01L 21/76224* (2013.01); *H01L 21/823431* (2013.01); *H01L 28/20* (2013.01); *H01L 29/0649* (2013.01); *H01L 29/6681* (2013.01); *H01L 29/66795* (2013.01); *H01L 29/7851* (2013.01); *H01L 21/823481* (2013.01)

(58) Field of Classification Search
CPC ............. H01L 27/0629; H01L 29/0649; H01L 29/7851; H01L 21/32055
USPC ........................................................ 257/380
See application file for complete search history.

(56) References Cited

U.S. PATENT DOCUMENTS 6,582,987 B2   6/2003   Jun et al.
6,969,656 B2   11/2005  Du et al.
(Continued)

OTHER PUBLICATIONS

Zhenxing Bi et al., "Resistor Fins", Related Application, U.S. Appl. No. 15/495,197, filed Apr. 24, 2017.
(Continued)

*Primary Examiner* — Bo Fan
(74) *Attorney, Agent, or Firm* — Cantor Colburn LLP; Vazken Alexanian

(57) ABSTRACT

A technique relates to forming resistor fins on a substrate. A shallow trench isolation material is formed on dummy fins and the substrate, and the dummy fins are formed on the substrate. Predefined ones of the dummy fins are removed, thereby forming voids in the shallow trench isolation material corresponding to previous locations of the predefined ones of the dummy fins. A first material is deposited into the voids. The height of the first material is reduced, thereby forming trenches in the shallow trench isolation material. A second material is deposited into the trenches to be on top of the first material, thereby forming the resistor fins of a resistor device. A metal contact layer is formed so as to contact a top surface of the first material at predefined locations.

20 Claims, 14 Drawing Sheets

(51) Int. Cl.
*H01L 21/762* (2006.01)
*H01L 21/8234* (2006.01)
*H01L 29/78* (2006.01)
*H01L 29/06* (2006.01)
*H01L 29/66* (2006.01)

(56) References Cited

U.S. PATENT DOCUMENTS

| | | |
|---|---|---|
| 7,064,413 B2 | 6/2006 | Fried et al. |
| 8,026,521 B1 | 9/2011 | Or-Bach et al. |
| 8,816,436 B2 | 8/2014 | Cheng et al. |
| 8,836,032 B2 | 9/2014 | Xia et al. |
| 9,236,267 B2 | 1/2016 | De et al. |
| 9,419,004 B2* | 8/2016 | Choi ................ H01L 27/11206 |
| 2007/0128740 A1 | 6/2007 | Donze et al. |
| 2015/0061076 A1* | 3/2015 | Cheng ................ H01L 27/0802 |
| | | 257/538 |
| 2015/0333057 A1 | 11/2015 | Hoentschel et al. |
| 2016/0190120 A1 | 6/2016 | Singh |

OTHER PUBLICATIONS

List of IBM Patents or Patent Applications Treated as Related, (Appendix P), Filed May 29, 2018; pp. 1-2.
Disclosed Anonymously, "Integrated Ciruits with FinFETs and Resistors," IP.com, IPCOM000241490D, May 5, 2015, pp. 1-3.

* cited by examiner

FIG. 12

```
FORM A SHALLOW TRENCH ISOLATION MATERIAL ON DUMMY FINS AND THE SUBSTRATE, THE DUMMY FINS
FORMED ON THE SUBSTRATE 1202
```
↓
```
REMOVE PREDEFINED ONES OF THE DUMMY FINS, THEREBY FORMING VOIDS IN THE SHALLOW TRENCH
ISOLATION MATERIAL CORRESPONDING TO PREVIOUS LOCATIONS OF THE PREDEFINED ONES OF THE
DUMMY FINS 1204
```
↓
```
DEPOSIT A FIRST MATERIAL INTO THE VOIDS 1206
```
↓
```
REDUCE A HEIGHT OF THE FIRST MATERIAL, THEREBY FORMING TRENCHES IN THE SHALLOW TRENCH
ISOLATION MATERIAL 1208
```
↓
```
DEPOSIT A SECOND MATERIAL INTO THE TRENCHES, THE SECOND MATERIAL BEING ON TOP OF THE FIRST
MATERIAL, THEREBY FORMING THE RESISTOR FINS OF A RESISTOR DEVICE 1210
```
↓
```
FORM A METAL CONTACT LAYER SO AS TO CONTACT A TOP SURFACE OF THE FIRST MATERIAL AT
PREDEFINED LOCATIONS 1212
```

FORM A SHALLOW TRENCH ISOLATION MATERIAL ON SACRIFICIAL FINS AND THE SUBSTRATE, THE SACRIFICIAL FINS BEING FORMED ON THE SUBSTRATE 1302

↓

REMOVE THE SACRIFICIAL FINS IN THE RESISTOR DEVICE WHILE REMOVING ONE OF THE SACRIFICIAL FINS IN THE FIELD-EFFECT-TRANSISTOR, THEREBY FORMING VOIDS IN THE SHALLOW TRENCH ISOLATION MATERIAL CORRESPONDING TO PREVIOUS LOCATIONS OF THE SACRIFICIAL FINS HAVING BEEN REMOVED 1304

↓

FORM A FIRST MATERIAL INTO THE VOIDS, THE FIRST MATERIAL HAVING A HEIGHT THAT FORMS TRENCHES IN THE SHALLOW TRENCH ISOLATION MATERIAL 1306

↓

FORM A SECOND MATERIAL INTO THE TRENCHES, THE SECOND MATERIAL BEING ON TOP OF THE FIRST MATERIAL 1308

↓

FORM A GATE AND SOURCE/DRAIN REGIONS IN THE FIELD-EFFECT-TRANSISTOR 1310

↓

FORM A METAL CONTACT LAYER SO AS TO CONTACT THE FIRST MATERIAL AT PREDEFINED LOCATIONS IN THE RESISTOR DEVICE AND TO CONTACT SOURCE/DRAIN REGIONS IN THE FIELD-EFFECT-TRANSISTOR 1312

RESISTOR FINS

DOMESTIC PRIORITY

This application is a divisional of U.S. application Ser. No. 15/495,197, titled "RESISTOR FINS" filed Apr. 24, 2017, the contents of which are incorporated by reference herein in its entirety.

BACKGROUND

The present invention relates generally to semiconductor device fabrication, and more specifically, to forming polysilicon fin resistors on a semiconductor substrate integrated with fabrication operations used to form field effect transistors (FETs).

Passive components such as RF band pass filters, inductors, capacitors, and resistors are employed in semiconductor-based ICs. Resistors have electrical resistivity characteristics and are typically employed with other passive and active electrical devices. Resistors are used for voltage biasing, current control, and adjusting signal levels, among other uses. For state-of-the-art complimentary-metal-oxide-semiconductor (CMOS) devices using high-k/metal gates, conventional polysilicon resistors (i.e., poly-resistors) are no longer feasible because of smaller device dimensions. Middle-of-line (MOL) metallic resistors are an alternative to poly-resistors.

SUMMARY

Embodiments of the invention are directed to a method for forming a resistor fins on a substrate. The method includes forming a shallow trench isolation material on dummy fins and the substrate, where the dummy fins formed on the substrate, and removing predefined ones of the dummy fins, thereby forming voids in the shallow trench isolation material corresponding to previous locations of the predefined ones of the dummy fins. The method includes depositing a first material into the voids, and reducing a height of the first material, thereby forming trenches in the shallow trench isolation material. The method includes depositing a second material into the trenches, the second material being on top of the first material, thereby forming the resistor fins of a resistor device, and forming a metal contact layer so as to contact a top surface of the first material at predefined locations.

Embodiments of the invention are also directed to a resistor fin device. The resistor fin device includes resistor fins formed on a substrate, where the resistor fins are formed of a first material and a second material. The resistor fin device includes a shallow trench isolation material formed between the resistor fins and a metal contact layer in contact with the resistor fins.

Embodiments of the invention are also directed to a method of forming a resistor fin device and a field-effect-transistor on a substrate. The method includes forming a shallow trench isolation material on sacrificial fins and the substrate, where the sacrificial fins are formed on the substrate. The method includes removing the sacrificial fins in the resistor fin device while removing one of the sacrificial fins in the field-effect-transistor, thereby forming voids in the shallow trench isolation material corresponding to previous locations of the sacrificial fins having been removed. The method includes forming a first material into the voids, such that the first material has a height that forms trenches in the shallow trench isolation material. Also, the method includes forming a second material into the trenches, where the second material is on top of the first material, and forming a gate and source/drain regions in the field-effect-transistor. Further the method includes forming a metal contact layer so as to contact the first material at predefined locations in the resistor fin device and to contact source/drain regions in the field-effect-transistor.

BRIEF DESCRIPTION OF THE DRAWINGS

The subject matter of embodiments of the present invention are particularly pointed out and distinctly defined in the claims at the conclusion of the specification. The foregoing and other features and advantages are apparent from the following detailed description taken in conjunction with the accompanying drawings in which:

FIG. 12 is a flow chart of a method for forming resistor fins on a substrate according to embodiments of the present invention; and FIG. 13 is a flow chart of a method of forming a resistor device and field-effect-transistor on a substrate according to embodiments of the present invention.

DETAILED DESCRIPTION

Figure 1A:
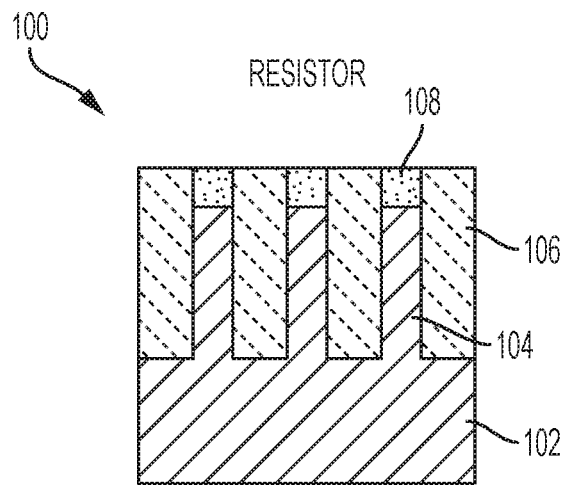
FIG. 1A depicts a cross-sectional view of a resistor structure with dummy fins according to embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and embodiments of the present invention are not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration." Any embodiment or design described herein as "exemplary" is not necessarily to be construed as preferred or advantageous over other embodiments or designs. The term "one or more" is understood to include any integer number greater than or equal to one, i.e. one, two, three, four, etc. The term "a plurality" is understood to include any integer number greater than or equal to two, i.e. two, three, four, five, etc. The term "connection" can include an indirect "connection" and a direct "connection".

References in the specification to "one embodiment," "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit (IC) fabrication can be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of aspects of the present invention, described are methods and structures for forming resistors onto a substrate in the form of resistor fins. The motivation for the present invention includes the ability to simultaneously form, and using the same processes to fabricate, resistor fins with CMOS devices, thus minimizing the number of needed process steps. In addition, the present methods allow for the formation of resistors on a substrate as an alternative to using poly-resistors or MOL resistors. Embodiments described herein include removing only portions of a first resistive material and replacing the first material with a second insulator material to form resistor fins. By depositing and then removing only portions of the first material, resistor fins of a specific predetermined resistance range can be formed. Finally, forming resistor fins as described herein allow for interconnections with CMOS devices using the same dies and metallized deposition layers, thus increasing reliability when forming and connecting resistor fins to CMOS devices.

Figure 1B:
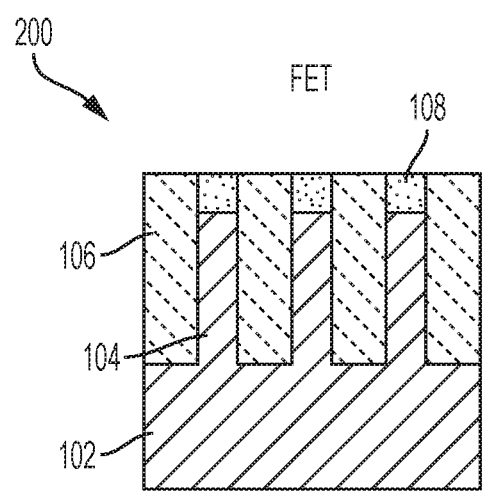
FIG. 1B depicts a cross-sectional view of a field-effect transistor (FET) structure with dummy fins according to embodiments of the present invention.

Embodiments of the present invention are described in detail below by referring to the accompanying drawings in FIGS. 1A-13. FIG. 1A depicts a cross-sectional view of a resistor fin structure 100 (resistor structure) at an intermediate stage of being formed on a substrate 102, and FIG. 1B depicts a cross-sectional view of a FET structure 200 at an intermediate stage of being formed on the substrate 102. According to embodiments of the present invention, the resistor structure 100 and the FET structure 200 are configured such that they are constructed from the same types of elements (e.g., fins, STI regions, hardmasks, etc.). Accordingly, elements of the resistor structure 100 that are of substantially the same type as elements of the FET structure 200 can be formed on the substrate 102 at substantially the same time using substantially the same fabrication processes. At the fabrication stage of the resistor structure 100 and the FET structure 200 shown in FIG. 1A and FIG. 1B, the resistor structure 100 and the FET structure 200 include substantially the same types of elements and have been formed on the substrate 102 at this stage of fabrication using the same fabrication processes. In the descriptions provided herein, elements of the resistor structure 100 that are of the same type as elements of the FET structure 200 will be provided with the same reference number. Additionally, in the descriptions provided herein, unless otherwise noted, the fabrication process described for elements of the resistor structure 100 that are of the same type as elements of the FET structure 200 apply equally to the FET structure 200. Similarly, unless otherwise noted, the fabrication process described for elements of the FET structure 200 that are of the same type as elements of the resistor structure 100 apply equally to the resistor structure 100.

Turning now to FIG. 1A, resistor structure 100 is shown according to one or more embodiments of the present invention. The resistor structure 100 includes the substrate 102, one or more dummy fins 104, a layer of STI material 106, and a fin hard mask 108. Three dummy fins 104 are illustrated in FIG. 1A. However, for ease of illustration, only one dummy fin 104 is provided with a reference number. The substrate 102 can include silicon, germanium, silicon germanium, silicon carbide, and those consisting essentially of III-V compound semiconductors. Other suitable substrates 102 include II-VI compound semiconductors. The substrate 102 can also include an organic semiconductor or a layered semiconductor such as, for example, Si/SiGe, a silicon-on-insulator, or a SiGe-on-insulator. A portion or the entire substrate 102 can be amorphous, polycrystalline, or monocrystalline. The substrate 102 can be doped or undoped, or contain doped regions and undoped regions therein. In one or more embodiments of the present invention, the dummy fins 104 are made of the same materials as the substrate 102, but other embodiments are possible. The STI material 106 is deposited onto the resistor structure 100 and can be made of a flowable oxide. In some embodiments, after deposition of the STI material 106, a planarization process can take place to remove unwanted material overfill off of the resistor structure 100. The fin hard mask 108 can be made of silicon nitride (SiN). In yet other embodiments, the fin hard mask 108 can be formed from the same material as the substrate 102.

The STI material 106 is used in integrated circuits to prevent electric current leakage between adjacent semiconductor device components. STI is generally used in CMOS process technology nodes of 250 nanometers and smaller. Older CMOS technologies and non-MOS technologies commonly use isolation based on "local oxidation of silicon" (LOCOS). STI is created early during the semiconductor device fabrication process before transistors or other devices are formed. The key steps of the STI deposition process involves etching a pattern of trenches in the silicon, depositing one or more dielectric materials (such as silicon dioxide) to fill the trenches, and removing the excess dielectric using a technique such as chemical-mechanical planarization.

FIG. 1B depicts a cross-sectional view of a FET structure 200 that incorporates a resistor fin according to one or more embodiments of the present invention. FIG. 1B uses the same reference numbers and the same or similar processes as shown in FIG. 1A as appropriate. In some cases, the dummy fins 104 can be doped with p-type dopants and/or n-type dopants to be utilized in a p-type FET or an n-type FET. It should be noted that the dummy fins 104 are only considered to be dummy fins (i.e., sacrificial fins) in the resistor structure 100. However, in the FET structure 200 the dummy fins 104 are not dummy fins but rather are the actual fins utilized to transmit the electron or hole current between the source and drain as understood by one skilled in the art. Although one dummy fin 104 is sacrificed, the other fins 104 remain in the FET structure 200. In some embodiments of the present invention, forming elements of the resistor structure 100 and the FET structure 200 on the substrate 102 can be performed at the same time using the same or similar processes. In the following figures, only those differences between resistor structure 100 and FET structure 200 will be illustrated.

Figure 2A:
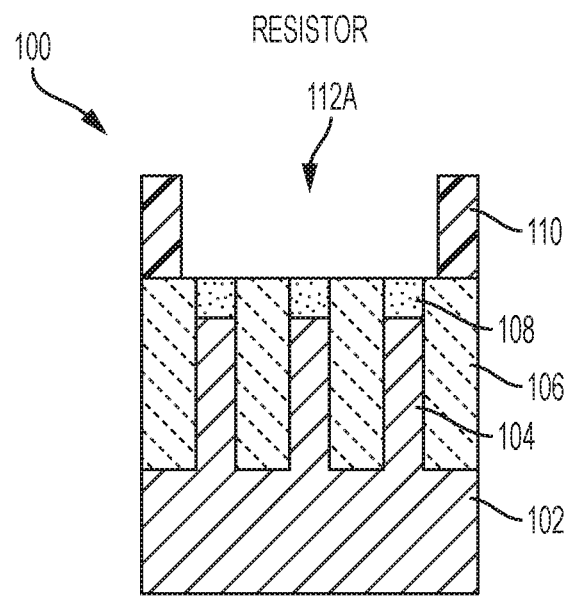
FIG. 2A depicts a cross-sectional view of the resistor structure after depositing a hard mask on the structure according to embodiments of the present invention.

In FIG. 2A, a first hard mask 110 is placed over the top of the resistor structure 100. The first hard mask 110 defines various openings, including first open region 112A. Once the first hard mask 110 has been deposited, exposed first open region 112A defines areas of the resistor structure 100 not protected from a future removal process. A first hard mask pattern (not shown) isolates areas that are pre-selected to remain while allowing other areas (e.g., fin hard mask 108 and dummy fins 104) to be exposed to a future removal process as shown in subsequent figures.

Figure 2B:
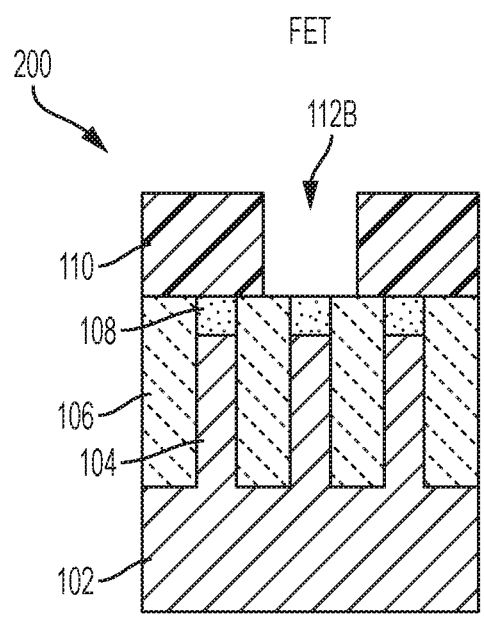
FIG. 2B depicts a cross-sectional view of the FET structure after depositing a hard mask on the structure according to embodiments of the present invention.

In FIG. 2B, the first hard mask 110 has been deposited onto the FET structure 200, thus defining a second open region 112B and exposing a dummy fin 104 to a future removal process as shown in subsequent figures. It should be appreciated that the other dummy fins 104 will remain in the FET structure 200.

Figure 3A:
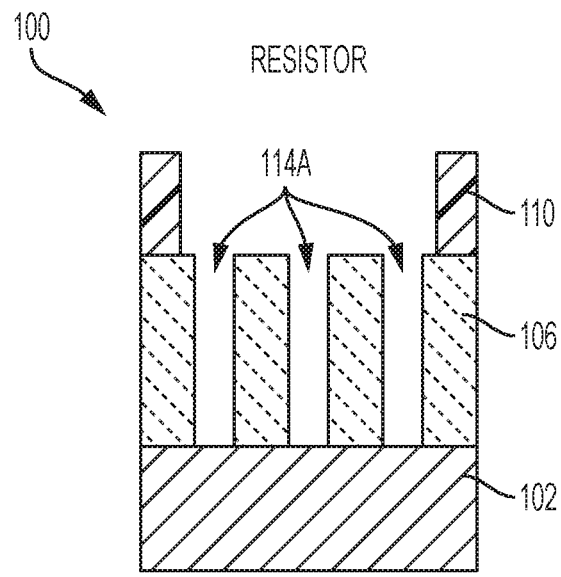
FIG. 3A depicts a cross-sectional view of the resistor structure after removing the dummy fins and forming trenches according to embodiments of the present invention.

In FIG. 3A, a mask pattern is placed over the resistor structure 100 and an etching process is performed. Methods of etching to remove material from the resistor structure 100 include gas phase hydrofluoric acid (HCl) and a wet etch process with an etchant containing ammonia and hydrogen peroxide. Alternatively, the etching process can include, but is not limited to, a directional anisotropic reactive-ion etching (RIE) process. Embodiments of the present invention are not limited as to the specific process applied for etching the structure, and other processes are possible. The etching process removes the fin hard mask 108 (of FIG. 2A) and dummy fins 104 (of FIG. 2A) down to a top surface of the substrate 102. The etching process, after removing material from the resistor structure 100, also creates a plurality of first trenches 114A that are located between the remaining STI material 106 in the spaces previously occupied by the dummy fins 104 and extends downwards to the substrate 102. The first trenches 114A define spaces where the resistor fins will be fabricated in a future process as described herein.

Figure 3B:
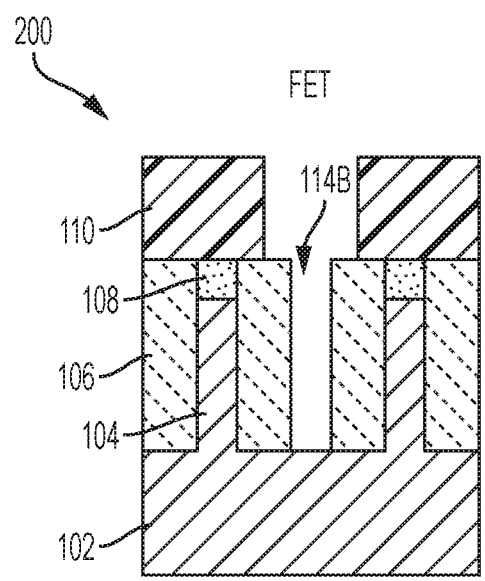
FIG. 3B depicts a cross-sectional view of the FET structure after removing a dummy fin and forming a trench according to embodiments of the present invention.

FIG. 3B depicts a cross-sectional view of the FET structure 200 after removing a dummy fin 104 and forming a second trench 114B according to one or more embodiments of the present invention. FIG. 3B is a continuation of the processes shown in FIG. 2B. An etching process removes the fin hard mask 108 and a dummy fin 104 (of FIG. 2B) down to a top surface of the substrate 102. The etching process, after removing material from the resistor structure 100, also creates a second trench 114B that is located between the remaining STI material 106 in the spaces where the dummy fin 104 previously occupied, and extends downwards to the substrate 102. The second trench 114B defines a space where the resistor fin will be fabricated in a future process as described herein.

Figure 4A:
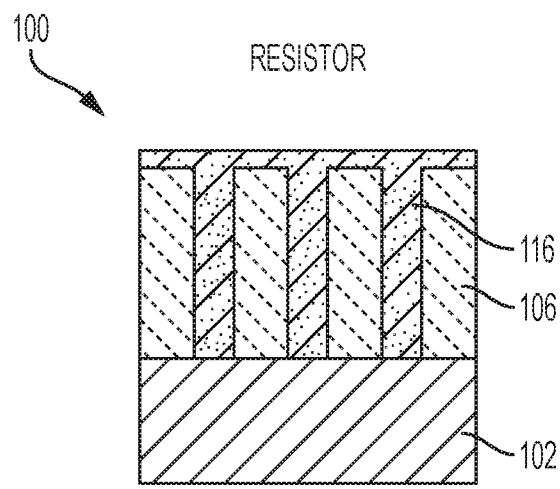
FIG. 4A depicts a cross-sectional view of the resistor structure after depositing a first material into the trenches according to embodiments of the present invention.

FIG. 4A depicts a cross-sectional view of the resistor structure 100 after removing the first hard mask 110 (of FIG. 3A) and depositing a first material 116 into the first trenches 114A (of FIG. 3A) according to one or more embodiments of the present invention. FIG. 4A is a continuation of the processes illustrated in FIG. 3A. The first material 116 is conformally deposited onto the resistor structure 100 in a uniform layer. The first material 116 fills the first trenches 114A (of FIG. 3A) that were formed by the removal process described earlier. First material 116 is formed of, but is not limited to, doped polysilicon (Si) that has resistive characteristics based on the volume and height, width, and length dimensions of the first material 116 as formed. In one or more embodiments of the present invention, a planarization process is conducted to remove excess overfill of the first material 116 from the top surface of the resistor structure 100.

Figure 4B:
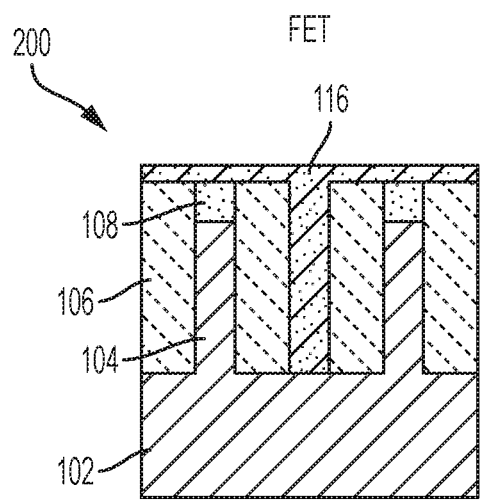
FIG. 4B depicts a cross-sectional view of the FET structure after depositing a first material into the trench according to embodiments of the present invention.

FIG. 4B depicts a cross-sectional view of the FET structure 200 after removing the first hard mask 110 (of FIG. 3B) and depositing a first material 116 into the second trench 114B (of FIG. 3B) according to one or more embodiments of the present invention. FIG. 4B is a continuation of the processes shown in FIG. 3B. The first material 116 is conformally deposited onto the FET structure 200 in a uniform layer. The first material 116 fills the second trench 114B (of FIG. 3B) that was formed by the removal process described earlier. First material 116 is formed of, but is not limited to, doped polysilicon (Si) that has resistive characteristics based on the volume and height, width, and length dimensions of the first material 116 as formed. In one or more embodiments of the present invention, a planarization process is conducted to remove excess overfill of the first material 116 from the top surface of the FET structure 200.

Figure 5A:
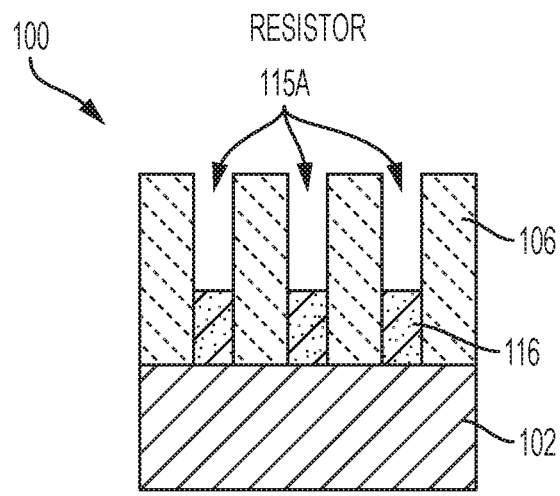
FIG. 5A depicts a cross-sectional view of the resistor structure after removing portions of the first material according to embodiments of the present invention.

FIG. 5A depicts a cross-sectional view of the resistor structure 100 after removing portions of the first material 116 according to one or more embodiments of the present invention. FIG. 5A is a continuation of the processes illustrated in FIG. 4A. The resistor structure 100 is shown after removing portions of the first material 116 by the same or a different removal process as shown in FIG. 3A. A plurality of third trenches 115A are formed after conducting the removal process. The third trenches 115A are in the same location as the first trenches 114A shown in FIG. 3A, although in the present figure the third trenches 115A are partially filled with a quantity of first material 116. The third trenches 115A are present between the STI material 106 and over the remaining first material 116. The third trenches 115A provide spaces for the deposition of additional layers of material as illustrated in the following figures.

Figure 5B:
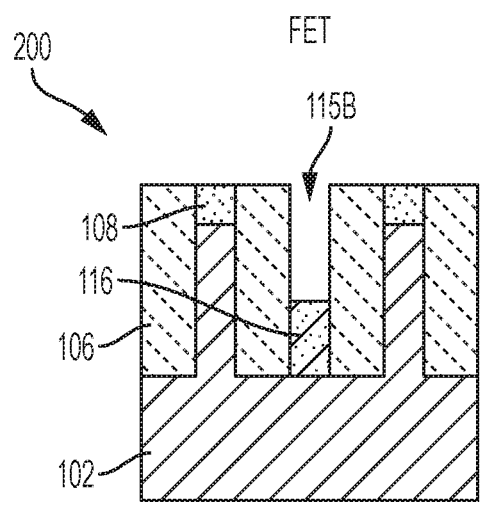
FIG. 5B depicts a cross-sectional view of the FET structure after removing portions of the first material according to embodiments of the present invention.

FIG. 5B depicts a cross-sectional view of the FET structure 200 after removing portions of the first material 116 according to one or more embodiments of the present invention. FIG. 5B is a continuation of the processes shown in FIG. 4B. The FET structure 200 is shown after removing portions of the first material 116 by the same or a different removal process as shown in FIG. 3A. After the removal process, a fourth trench 115B is formed. The fourth trench 115B is in the same location as the second trench 114B shown in FIG. 3B, although in the present figure the fourth trench 115B is partially filled with a quantity of first material 116. The fourth trench 115B is present in the STI material 106 and over the remaining first material 116. The fourth trench 115B provides space for the deposition of additional layers of material as illustrated in the following figures.

Figure 6A:
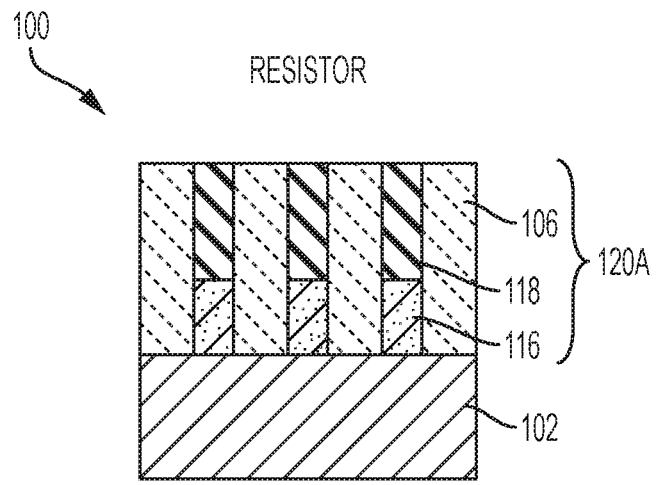
FIG. 6A depicts a cross-sectional view of the resistor structure after depositing a second material to form resistor fins according to embodiments of the present invention.

FIG. 6A depicts a cross-sectional view of the resistor structure 100 after depositing a second material 118 to form a plurality of first resistor fins 120A according to one or more embodiments of the present invention. FIG. 6A is a continuation of the processes illustrated in FIG. 5A. The second material 118 is conformally deposited on top of the first material 116, and a planarization process is conducted to remove excess overfill of the second material 118 from the top surface of the resistor structure 100. Suitable materials for the second material 118 include, but are not limited to, silicon-carbon-oxide (SiCO). The first material 116 and the second material 118 form a plurality of resistor fins 120A as shown in subsequent figures. The second material 118 is an electrical insulator used to isolate the resistor fins 120A from the surrounding resistor structure 100. The resulting resistor structure 100 includes the substrate 102, the plurality of resistor fins 120A formed from first material 116 and second material 118, and STI material 106.

Figure 6B:
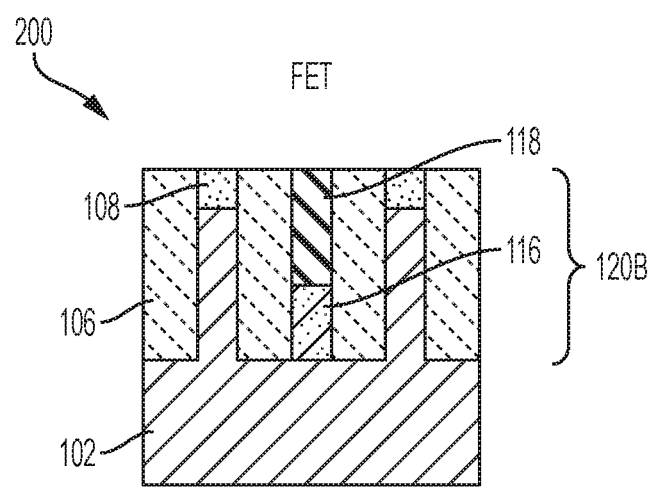
FIG. 6B depicts a cross-sectional view of the FET structure after depositing a second material to form a resistor fin according to embodiments of the present invention.

FIG. 6B depicts a cross-sectional view of the FET structure 200 after depositing the second material 118 to form a second resistor fin 120B according to one or more embodiments of the present invention. The second resistor fin 120B includes the first material 116 and the second material 118 in the FET structure 200. FIG. 6B is a continuation of the processes shown in FIG. 5B. The second material 118 is conformally deposited on top of the first material 116. The second material 118 is formed of, but is not limited to, SiCO. Combined, the first material 116 and the second material 118 make up the materials to form the second resistor fin 120B as shown in the following figures. The second material 118 is an electrical insulator used to isolate the second resistor fin 120B from the surrounding FET structure 200. In one or more embodiments, a planarization process is conducted to remove excess overfill of the second material 118 from the top surface of the FET structure 200. The resulting FET structure 200 includes the substrate 102 with the second resistor fin 120B exhibiting an extended length and formed of first material 116 and second material 118 and surrounded by STI material 106.

Figure 7A:
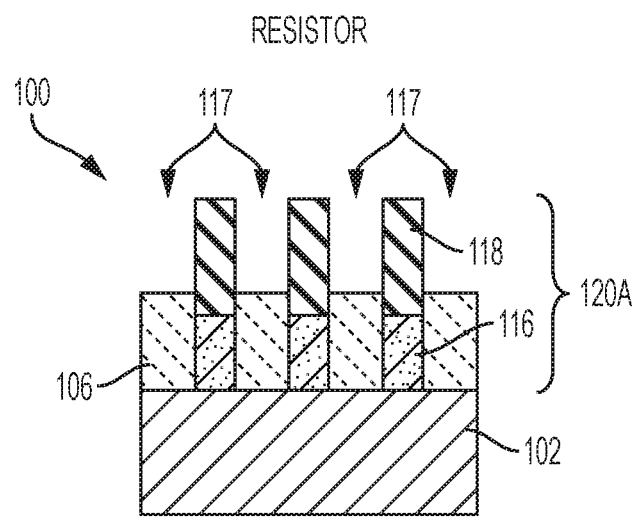
FIG. 7A depicts a cross-sectional view of the resistor structure after removing portions of the shallow trench isolation (STI) layer according to embodiments of the present invention.

FIG. 7A depicts a cross-sectional view of the resistor structure 100 after removing portions of the STI material 106 by the same or a different etching process as illustrated in FIG. 3A, thus producing one or more first void regions 117. Once the STI material 106 is removed, portions of the resistor fins 120A are exposed. The second material 118 acts as a hard mask to protect the first material 116 during the etching process.

Figure 7B:
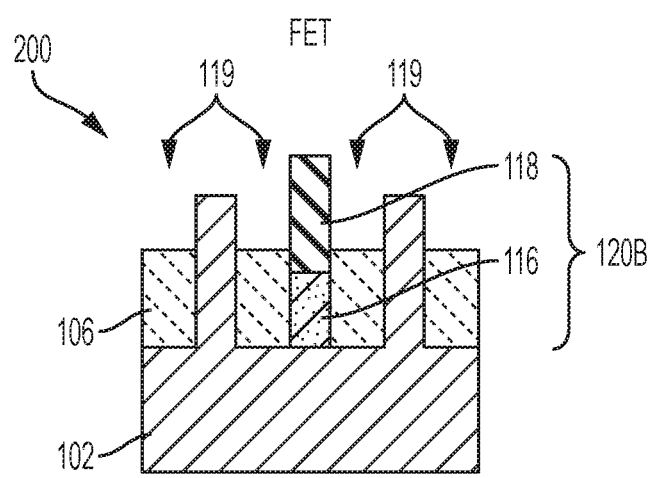
FIG. 7B depicts a cross-sectional view of the FET structure after removing portions of the STI layer according to embodiments of the present invention.

FIG. 7B depicts a cross-sectional view of the FET structure 200 after removing portions of the STI material 106 by the same or a different etching process as illustrated in FIG. 3B, thus producing one or more second void regions 119. Once the STI material 106 is removed, portions of the second resistor fin 120B is exposed. Also, fins 104 formed of the substrate 102 (extending upward) are exposed by the second void regions 119. In FIG. 7B, the fins 104 extending up from the substrate 102 are on both sides of the second resistor fin 120B.

Figure 8A:
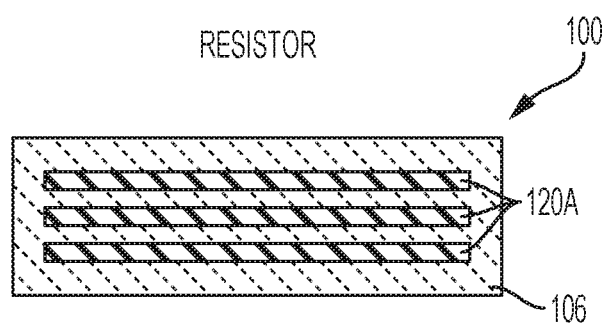
FIG. 8A depicts a top-down view of the resistor structure showing exposed resistor fins according to embodiments of the present invention.

FIG. 8A depicts a top-down view of the resistor structure 100 showing exposed second resistor fins 120A over the STI material 106. The STI material 106 is positioned over the substrate 102. The second material 118 of the second resistor fins 120A is seen from the top-down view.

Figure 8B:
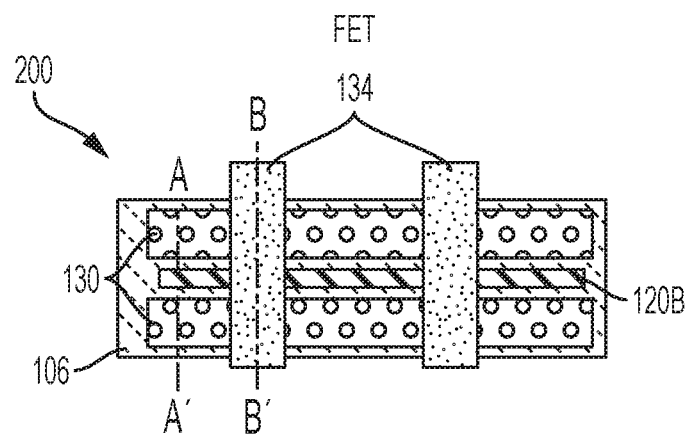
FIG. 8B depicts a top-down view of the FET structure showing an exposed resistor fin and after forming a gate according to embodiments of the present invention.

FIG. 8B depicts a top-down view of the FET structure 200 after forming one or more gate structures 134 (gate) first and an epitaxially growing source/drain region 130 (source/drain or S/D) on top surface of the FET structure 200. The second resistor fin 120B is also shown. The one or more gates 134 are only formed in the FET structure 200 and not on the resistor structure 100. The gates 134 are formed in a pattern that covers a selected part of the second resistor fin 120B and the fins 104. The source/drain region 130 is epitaxilly grown on the fins 104 formed of the substrate 102 (previously exposed by the second void regions 119). As can be seen, the source/drain region 130 is not formed on the second resistor fin 120B in the FET structure 200. In one or more embodiments of the present invention, the gates 134 includes a high-k gate dielectric and a gate conductor. The gate 134 can be, but is not limited to, made of silicon oxide, silicon nitride, silicon oxynitride, boron nitride, high-k materials, or any combination of these materials. Arbitrary cut lines A-A' and B-B' of the FET structure 200 are shown in more detail in the following figures.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (SiC) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate 134 material can further include dopants such as lanthanum and aluminum. The gate conductor material can include doped polycrystalline or amorphous silicon, germanium, silicon germanium, a metal (e.g., tungsten, titanium, tantalum, ruthenium, zirconium, cobalt, copper, aluminum, lead, platinum, tin, silver, or gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, or nickel silicide), carbon nanotube, conductive carbon, graphene, or any suitable combination of these materials. The conductive material can further include dopants that are incorporated during or after deposition. The gate 134 can further include a work function setting layer. The work function layer can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

Figure 8C:
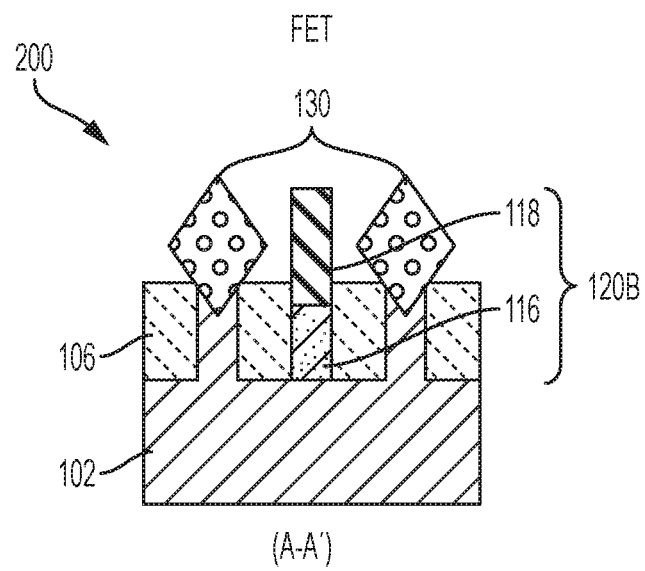
FIG. 8C depicts a cross-sectional view of the FET structure showing an exposed resistor fin and source/drain regions according to embodiments of the present invention.

FIG. 8C depicts a cross-sectional view of the FET structure 200 showing an exposed second resistor fin 120B and epitaxially-grown source/drain regions 130 according to one or more embodiments of the present invention. FIG. 8C is a continuation of the processes shown in FIG. 8B and shows the cross-sectional view at the cut line A-A' of FIG. 8B. FIG. 8C includes the second resistor fin 120B on the substrate 102 as shown in FIG. 8B.

Figure 8D:
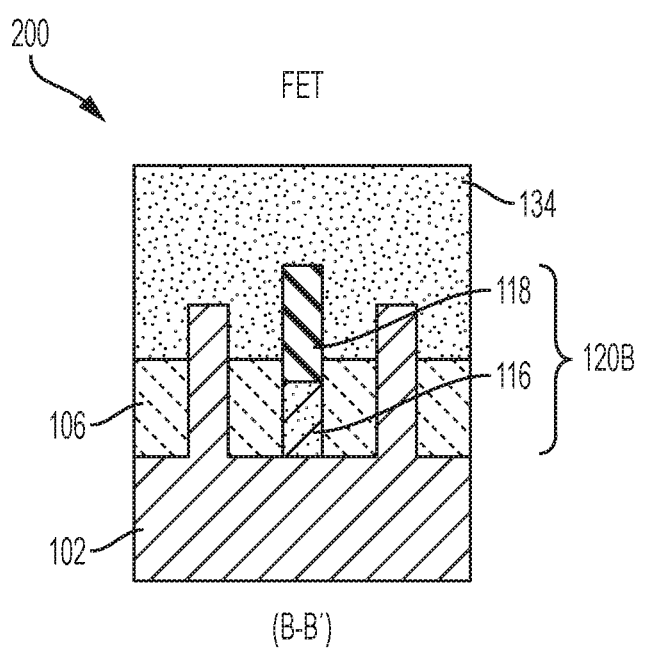
FIG. 8D depicts a cross-sectional view of the FET structure showing a resistor fin and a gate according to embodiments of the present invention.

FIG. 8D depicts a cross-sectional view of the FET structure 200 showing the second resistor fin 120B and a gate 134 according to one or more embodiments of the present invention. FIG. 8D is a continuation of the processes shown in FIG. 8B and shows the cross-sectional view at the cut line B-B' of FIG. 8B.

Figure 9A:
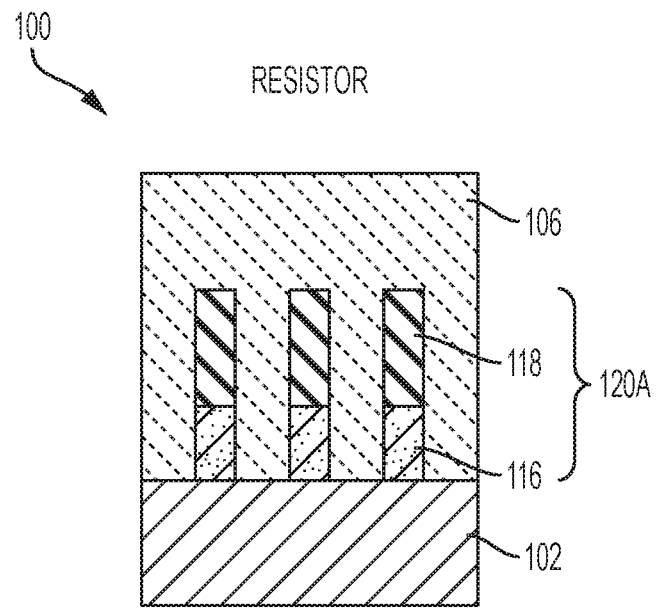
FIG. 9A depicts a cross-sectional view of the resistor structure after depositing STI material according to embodiments of the present invention.

FIG. 9A depicts a cross-sectional view of the resistor structure 100 after depositing a STI material 106 according to one or more embodiments of the present invention. FIG. 9A is a continuation of the processes illustrated in FIG. 8A. In this view, an additional layer of STI material 106 is deposited onto the resistor structure 100 and surrounding the resistor fins 120A.

Figure 9B:
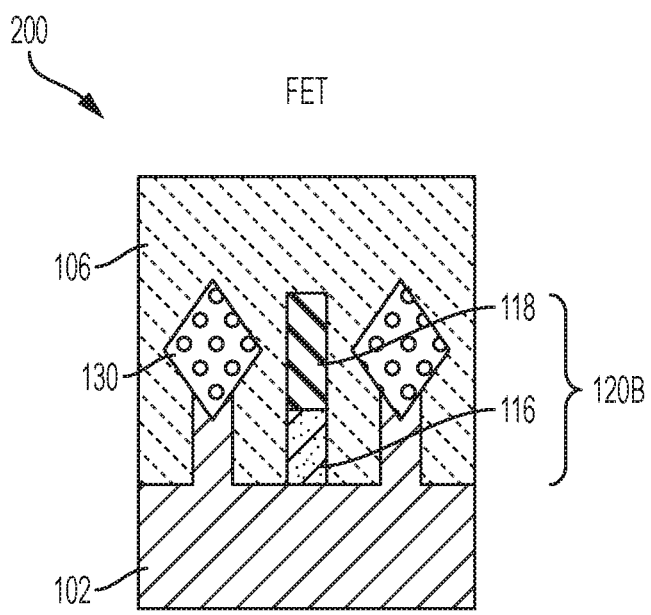
FIG. 9B depicts a cross-sectional view of the FET structure after depositing STI material according to embodiments of the present invention.

FIG. 9B depicts a cross-sectional view of the FET structure 200 after depositing a STI material 106 according to one or more embodiments of the present invention. FIG. 9B is a continuation of the processes shown in FIG. 8B. In this view, an additional layer of STI material 106 is deposited onto the FET structure 200. As can be seen, the additional layer of STI material 106 is deposited to surround the source/drains 130 and the second resistor fin 120B.

Figure 10A:
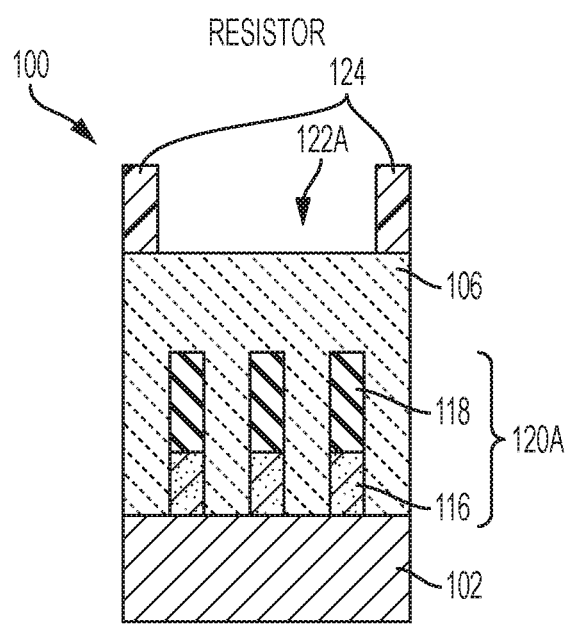
FIG. 10A depicts a cross-sectional view of the resistor structure after depositing a hard mask according to embodiments of the present invention.

FIG. 10A depicts a cross-sectional view of the resistor structure 100 after depositing a second hard mask 124 according to one or more embodiments of the present invention. FIG. 10A is a continuation of FIG. 9A. The second hard mask 124 is deposited onto the resistor structure 100 using a deposition process as shown in FIG. 2A. In some embodiments of the present invention, a separate deposition process is used to apply the second hard mask 124. After the deposition of the second hard mask 124 onto the resistor structure 100, a first recess region 122A (first recess) is created that is devoid of material and defines areas that are exposed to a future etching process. In some embodiments of the present invention, the second hard mask 124 can be a photoresist.

Figure 10B:
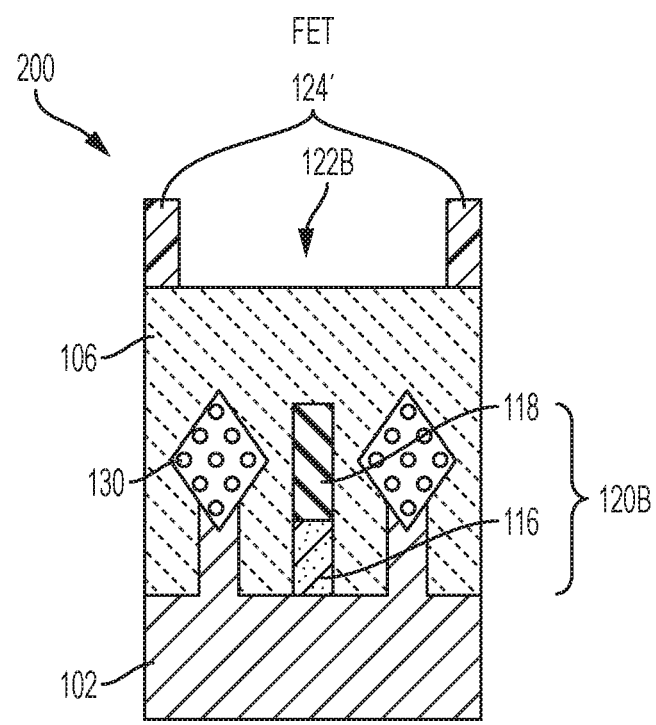
FIG. 10B depicts a cross-sectional view of the FET structure after depositing a hard mask according to embodiments of the present invention.

FIG. 10B depicts a cross-sectional view of the FET structure 200 after depositing second hard mask 124' according to one or more embodiments of the present invention. FIG. 10B is a continuation of the processes shown in FIG. 9B. The second hard mask 124' is deposited onto the FET structure 200 using a deposition process as shown in FIG. 2A. After the deposition of the second hard mask 124' onto the FET structure 200, a second recess region 122B (second recess) is created that defines an area that are exposed to a future etching process. A separate etch process is utilized to open the second recess region 122B in FET structure 200 than to open the first recess region 122A in the resistor structure 100.

Figure 11A:
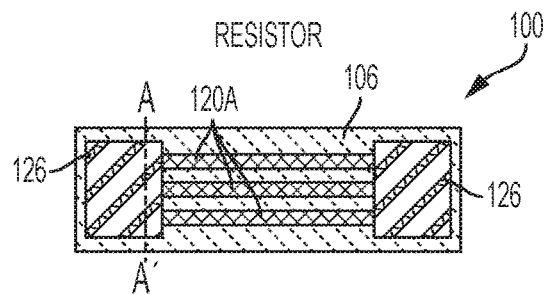
FIG. 11A depicts a top-down view of completed resistor fins on a semiconductor structure after creating recesses and adding a metal contact layer according to embodiments of the present invention.

FIG. 11A depicts a top-down view of the completed resistor structure 100 after adding a metal contact layer 126 according to one or more embodiments of the present invention. FIG. 11A is a continuation of FIG. 10A. In one or more embodiments, an etching process is conducted to remove portions of the STI material 106 from the resistor structure 100. In the previous view shown in FIG. 10A, the resistor structure 100 is partially covered by the second hard mask 124. The purpose of the second hard mask 124 and the etching process that follows is to define/etch an area in the STI material 106 (of FIG. 10A) where the metal contact layer 126 (metal contacts) are to be deposited. As defined by the first recess region 122A, the etching process causes STI material 106 to be removed and causes the second material 118 to be removed so that the first material 116 is exposed. In accordance with first recess region 122A created by the second hard mask 124, this etching process occurs at only predefined locations on the first resistor fins 120A in the resistor structure 100. Subsequently, two material contacts 126 are formed on the exposed areas of the first material. The second hard mask 124 is removed. In the present view of FIG. 11A, the two metal contacts 126 are electrically connected to the resistor fins 120A (on the first material 116) for use in a semiconductor structure device as required. In at least some embodiments of the present invention, the metal contacts 126 will be located at the longitudinal ends of the resistor fins 120A. The first resistor fins 120A are covered by the STI material 106 and only hidden lines are shown to represent the covered first resistor fins 120A. In some embodiments of the present invention, an optional planarization process can be performed to reduce the height of the metal contacts 126. The metal contacts 126 can further include a work function setting layer (not shown). The work function setting layer can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

Figure 11B:
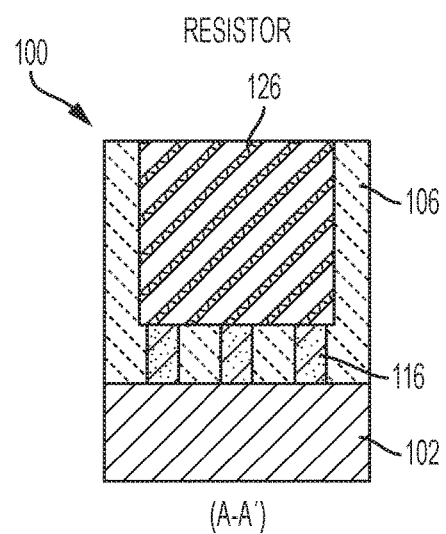
FIG. 11B depicts a cross-sectional view of completed resistor fins on a semiconductor structure according to embodiments of the present invention.

FIG. 11B depicts a cross-sectional view of the completed resistor structure 100 depicted in FIG. 11A according to one or more embodiments of the present invention. FIG. 11B is a continuation of the processes illustrated in FIG. 11A. FIG. 11B shows another view of the completed resistor structure 100, with the substrate 102, the plurality of resistor fins, of which only the first material 116 is shown, and the metal contact 126. In FIG. 11B, it can be seen that the metal contact 126 is formed on the exposed portions of the first material 116, after the etching process removes STI material 106 and the second material 118 at the predefined locations in the resistor structure 100.

Figure 11C:
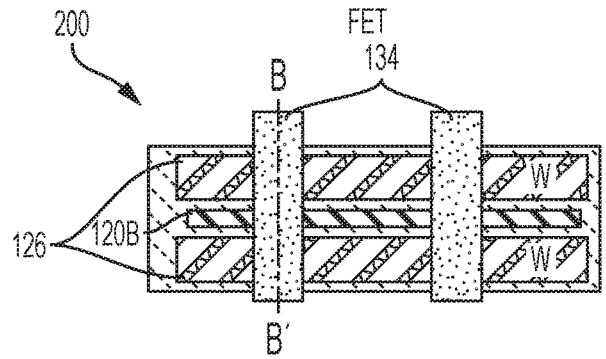
FIG. 11C depicts a top-down view of the completed resistor fin with a FET structure after creating recesses and adding a metal contact layer according to embodiments of the present invention.

FIG. 11C depicts a top-down view of the completed FET structure 200 after creating the resistor fin 120B and adding the metal contact layers 126 according to one or more embodiments of the present invention. FIG. 11C is a continuation of the processes shown in FIG. 10B. FIG. 11C also includes an arbitrary cut line B-B' as illustrated in the following figure. In the previous view shown in FIG. 10B, the FET structure 200 is partially covered by the second hard mask 124'. The purpose of the second hard mask 124' (showing second recess region 122B of FIG. 10B) and the etching process that follows is to define an area in the STI material 106 where the metal contact layer 126 (metal contacts) are deposited. As defined by the first recess region 122A, the etching process causes STI material 106 to be removed but does not remove the second material 118 of the second resistor fin 120B in the FET structure 200. Therefore, the first material 116 is not exposed in the FET structure 200. It is noted that a separate etch process is utilized to remove STI material 106 (but not the second material 118 of the second resistor fin 120B) in the FET structure 200 from the etch process to remove the second material 118 of the first resistor fins 120A in the resistor device 100. Subsequently, the metal contact 126 is formed on the source/drain regions 130 but not on the second material 118 of the second resistor fin 120B.

Figure 11D:
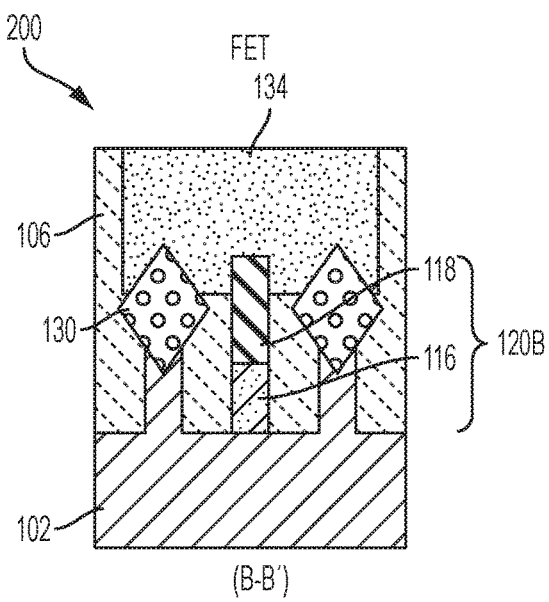
FIG. 11D depicts a cross-sectional view of the completed resistor fin with a FET structure depicted in FIG. 11C according to embodiments of the present invention.

FIG. 11D depicts a cross-sectional view of the completed resistor fin 120B with a FET structure 200 shown in FIG. 11C according to one or more embodiments of the present invention. FIG. 11D is a continuation of the processes illustrated in FIG. 10B. This view includes gate 134, source/drains 130, and second resistor fin 120B as shown in the preceding figures.

It should be appreciated that metal interconnections can be formed between the resistor fin device 100 and other semiconductor devices on the substrate 102.

FIG. 12 depicts a flow chart of method 1200 for forming resistor fins on a substrate 120 according to embodiments of the present invention. At block 1202, shallow trench isolation material 106 is formed on dummy fins 104 and the substrate 102, where the dummy fins 104 are formed on the substrate 102. At block 1204, predefined ones of the dummy fins 104 are removed, thereby forming voids 114A, 114B in the shallow trench isolation material 106 corresponding to previous locations of the predefined ones of the dummy fins 104 that were removed. At block 1206, a first material 116 is deposited into the voids 114A, 114B.

At block 1208, a height of the first material 116 is reduced, thereby forming trenches 115A, 115B in the shallow trench isolation material 106. At block 1210, a second material 118 is deposited into the trenches 115A, 115B, where the second material 118 is on top of the first material 116, thereby forming the resistor fins 120B of the resistor fin device 100. At block 1212, a metal contact layer 126 is formed so as to contact a top surface of the first material 116 at predefined locations.

The first material 116 is a resistive material with a resistivity value so as to contact electricity. A field-effect-transistor 200 is formed at a same time as form the resistor fin device 100. The field-effect-transistor 200 includes one of the resistor fins 120B. The field-effect-transistor 200 includes source/drain regions 130 formed on other fins 104.

The first material 116 includes a doped polysilicon material. The second material 118 is an electrically-isolating insulator. The metal contact layer 126 includes a work function setting layer.

FIG. 13 is a flow chart of a method 1300 of forming a resistor device 100 and field-effect-transistor 200 on a substrate 102 according to embodiments of the present invention. At block 1302, a shallow trench isolation material 106 formed on sacrificial fins 104 and the substrate 102, where the sacrificial fins 104 are formed on the substrate 102. At block 1304, the sacrificial fins 104 are removed in the resistor device 100 while removing one of the sacrificial fins 104 in the field-effect-transistor 200, thereby forming voids 114A, 114B in the shallow trench isolation material 106 corresponding to previous locations of the sacrificial fins 104 having been removed. At block 1306, a first material 116 is formed into the voids 114A, 114B, where the first material 116 has a height that forms trenches 115A, 115B in the shallow trench isolation material 106.

At block 1308, a second material 118 formed into the trenches 115A, 115B, where the second material 118 is on top of the first material 116. At block 1310, a gate 134 and source/drain regions 130 are formed in the field-effect-transistor 200. At block 1312, a metal contact layer 126 is formed so as to contact the first material 116 at predefined locations in the resistor device 100 and to contact source/drain regions 130 in the field-effect-transistor 200.

The first material 116 is a doped polysilicon material. The second material 118 is an electrically-isolating insulator material. The first material 116 is a resistive material with a resistivity value.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The corresponding structures, materials, acts, and equivalents of all means or step plus function elements in the claims below are intended to include any structure, material, or act for performing the function in combination with other claimed elements as specifically claimed. Embodiment of the present invention have been presented for purposes of illustration and description, but is not intended to be exhaustive or limited to the form described. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The flowchart and block diagrams in the figures illustrate the functionality and operation of possible implementations of systems and methods according to various embodiments of the present invention. In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. The actions can be performed in a differing order or actions can be added, deleted or modified. Also, the term "coupled" describes having a signal path between two elements and does not imply a direct connection between the elements with no intervening elements/connections there between. All of these variations are considered a part of the invention.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The terminology used herein is for describing particular embodiments only and is not intended to be limiting of embodiments of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated integers, steps, operations, elements, and/or components, but do not preclude the presence or addition of one or more other integers, steps, operations, element components, and/or groups thereof.

While embodiments of the present invention have been described in detail in connection with only a limited number of embodiments, it should be readily understood that embodiments of the present invention are not limited to such described embodiments. Rather, embodiments of the present invention can be modified to incorporate any number of variations, alterations, substitutions or equivalent arrangements not heretofore described, but which are commensurate with the spirit and scope of the present invention. Additionally, while various embodiments of the present invention have been described, it is to be understood that aspects of the present invention can include only some of the described embodiments. Accordingly, the present invention is not to be seen as limited by the foregoing description, but is only limited by the scope of the appended claims.

What is claimed is:

1. A resistor fin device comprising:
resistor fins formed on a substrate, wherein the resistor fins are formed of a first material and a second material;
a shallow trench isolation material formed between the resistor fins; and
a metal contact layer in direct contact with the resistor fins.

2. The device of claim 1, wherein the first material is a doped polysilicon material.

3. The device of claim 1, wherein the second material is an electrically-isolating insulator material.

4. The device of claim 1, wherein the first material a resistive material with a resistivity value.

5. The device of claim 1, further comprising a field-effect-transistor formed at a same time as forming the resistor fin device.

6. The device of claim 5, wherein the field-effect-transistor includes one of the resistor fins.

7. The device of claim 6, wherein the field-effect-transistor includes source/drain regions formed on other fins, the other fins being formed from the substrate.

8. The device of claim 1, wherein the metal contact layer comprises a work function setting layer.

9. The device of claim 8, wherein the work function setting layer comprises nitride.

10. The device of claim 8, wherein the work function setting layer is selected from the group consisting of titanium nitride (TiN), hafnium nitride (HfN), hafnium silicon nitride (HfSiN), tantalum nitride (TaN), and tantalum silicon nitride (TaSiN).

11. The device of claim 8, wherein the work function setting layer is selected from the group consisting of tungsten nitride (WN), molybdenum nitride (MoN), and niobium nitride (NbN).

12. The device of claim 8, wherein the work function setting layer comprises carbide.

13. The device of claim 8, wherein the work function setting layer is selected from the group consisting of titanium carbide (TiC), titanium aluminum carbide (TiAlC), tantalum carbide (TaC), and hafnium carbide (HfC).

14. The device of claim 1, wherein the metal contact layer is located at longitudinal ends of the resistor fins.

15. The device of claim 1, wherein the shallow trench isolation material comprises oxide.

16. The device of claim 5, wherein the field-effect-transistor comprises one or more gate structures.

17. The device of claim 16, wherein the one or more gate structures comprise a high-k dielectric material.

18. The device of claim 16, wherein the one or more gate structures is selected from the group consisting of silicon oxide, silicon nitride, silicon oxynitride, and boron nitride.

19. The device of claim 5, wherein the field-effect-transistor comprises an epitaxially grown source/drain region.

20. The device of claim 1, wherein the substrate comprises a semiconductor material.

* * * * *